United States Patent
Kunishima

[11] Patent Number: 6,121,649
[45] Date of Patent: Sep. 19, 2000

[54] SEMICONDUCTOR DEVICE WITH FERROELECTRIC CAPACITORS

[75] Inventor: Iwao Kunishima, Yokohama, Japan

[73] Assignee: Kabushiki Kaisha Toshiba, Kawasaki, Japan

[21] Appl. No.: 09/353,639

[22] Filed: Jul. 15, 1999

[30] Foreign Application Priority Data

Jul. 15, 1998 [JP] Japan .................. 10-214774

[51] Int. Cl.⁷ .................. H01L 29/80
[52] U.S. Cl. .......... 257/295; 257/295; 257/296; 257/298; 257/300; 257/310; 456/239; 456/240
[58] Field of Search .................. 257/296, 303, 257/306, 310, 311, 304, 295, 298, 300; 361/305; 365/145; 456/239, 240

[56] References Cited

U.S. PATENT DOCUMENTS

| | | | |
|---|---|---|---|
| 5,668,041 | 9/1997 | Okadaira et al. | 438/240 |
| 5,708,284 | 1/1998 | Onishi | 257/295 |
| 5,717,236 | 2/1998 | Shinkawata | 257/306 |
| 5,753,946 | 5/1998 | Naiki et al. | 257/295 |
| 5,767,541 | 6/1998 | Hanagasaki | 257/295 |
| 5,768,185 | 6/1998 | Nakamura et al. | 365/185.01 |
| 5,774,832 | 4/1998 | Wolters et al. | 257/295 |
| 5,990,507 | 11/1999 | Mochizuki et al. | 257/295 |

OTHER PUBLICATIONS

IEEE Journel, "A High Stability Electrode Technology for Stacked $SrBi_2Ta_2O_9$ Capacitors Applicable to Advanced Ferroelectric Memory", J. Kudo et al., 1997, pp. 25.4.1–25.4.4.

Primary Examiner—Matthew Smith
Assistant Examiner—Belur Keshavan
Attorney, Agent, or Firm—Banner & Witcoff, Ltd.

[57] ABSTRACT

A non-volatile memory has transistors and capacitors formed on a semiconductor substrate. The capacitors have a lower electrode, a ferroelectric film and an upper electrode stacked in order. An insulating film with at least one contact hole is formed on the substrate to cover the gate of each transistor. A side-wall insulating film is also formed to cover the side faces of the lower electrode and the ferroelectric film. A contact electrically connects the upper electrode and the source or drain of each transistor. The side-wall insulating film electrically isolates the contact from the lower electrode. The contact is made of a material at least the portion connected to the upper electrode and the other portion adjacent to that portion. The upper electrode is also made of that material. The upper electrode and the portion of the contact connected to the upper electrode are thus joined each other.

7 Claims, 13 Drawing Sheets

SEMICONDUCTOR DEVICE WITH FERROELECTRIC CAPACITORS

BACKGROUND OF THE INVENTION

The present invention relates to semiconductor devices. Particularly, this invention relates to non-volatile semiconductor memories having ferroelectric capacitors, and methods of fabricating such non-volatile semiconductor memories.

Ferroelectric memory cells having a ferroelectric thin film have been developed for highly reliable non-volatile semiconductor memories with low power consumption.

Such a non-volatile semiconductor memory is described with respect to FIG. 25.

A silicon oxide Film ($SiO_2$) 102 is formed on a semiconductor substrate 101 for shallow trench isolation. A gate electrode 104 is formed on the substrate 101 via another $SiO_2$ 106. The gate electrode 104 is covered with an insulating film 109 and a side-wall insulating film 108 at its top and side faces, respectively. The films 108 and 109 are made of $Si_3N_4$ or $SiO_2$, etc.

The substrate 101 is doped with impurities by ion implantation to form an impurity diffusion layer 103 at a shallow depth of 0.1 μm for fabricating a transistor Tr.

A mid-layer insulating film 105 is deposited over the substrate 1 and flattened by chemical mechanical polishing (CMP). A contact hole (window) 161 is formed in the film 105. The hole 161 is filled with a tungsten film 107 by blanket chemical vapor deposition (CVD). The tungsten film overflowed the hole 161 is removed by CMP. Formed between the inner wall of the hole 161 and the film 107 is a barrier metal layer of Ti/TiN.

Formed over the mid-layer insulating film 105 is an insulating film ($Si_3N_4$) 110 which will be the base layer of a capacitor. A lower electrode 191, a ferroelectric film 192 and an upper electrode 193 are deposited in order on the insulating film 110 as capacitor layers. The capacitor layers are processed into a shape shown in FIG. 25 by reactive ion etching (RIE).

A mid-layer insulating film ($SiO_2$) 111 is deposited over the insulating film 110 to cover the capacitor layers. Contact holes (window) 163 and 164 are formed in the film 111 and filled with tungsten films 162 by blanket CVD. The tungsten films overflowed the holes 163 and 164 are removed by CMP.

The contact hole 163 is formed on the contact hole 161 so that the tungsten films 107 and 162 are electrically connected to each other. The contact hole 164 is formed on the upper electrode 193 so that the tungsten film 162 in the hole 164 is electrically connected to the upper electrode 193. A barrier metal layer of Ti/TiN is also formed between the inner wall of the holes 163 and 164 and the film 162.

An electrode 112 of aluminum for wiring is formed on the mid-layer insulating film 111 by patterning. The electrode 112 is electrically connected to the tungsten films 162 in the contact holes 163 and 164 so that the upper electrode 193 of the capacitor is electrically connected to the impurity diffusion layer 103.

The capacitor and transistor pair formed as described above is used for ferroelectric random access memories (FRAMs). Such a semiconductor memory mostly has an array of memory cells each having two capacitors and two transistors.

As shown in FIG. 25, the gate electrode 104 functions as a word line (WL). Tungsten films 107a and 162a buried in contact holes 161a and 163a, respectively, are connected to an electrode 112a which is then connected to a bit line (BL).

Ferroelectric memory cells as described above are disadvantageous in that at least three contact holes 161, 163 and 164 are required to form electrical connection between the semiconductor substrate 101 and the upper electrode 193. Each contact hole requires photolithography and reactive ion etching (RIE) processes due to difference in depth.

The contact hole 163 and the three layers 191, 192 and 193 of the capacitor must be separated from each other to avoid short-circuit which would occur due to their misarrangement in photolithography. This results in a large space for each memory cell on a semiconductor substrate to retard device miniaturization.

Ferroelectric capacitors which are extremely thicker than usual capacitors give a very large aspect ratio of the diameter to depth of the contact hole 163. Such an aspect ratio degrates electrical conducting through the contact hole 163. This also retards device miniaturization, and does not meet the demands for mobile communications using, such as, non-contact identity cards.

SUMMARY OF THE INVENTION

A purpose of the present invention is to provide a semiconductor devices having ferroelectric capacitors and a method of fabricating such devices to advance device miniaturization.

The present invention provides a semiconductor device having at least one transistor formed on a semiconductor substrate, the transistor having a source, a drain and a gate. Also formed on the substrate to cover the gate is an insulating film having at least one contact hole. The semiconductor device also has at least one capacitor formed on the insulating film, the capacitor having a lower electrode, a ferroelectric film and an upper electrode stacked in order. A side-wall insulating film is formed to cover side faces of the lower electrode and the ferroelectric film. The semiconductor device has a contact having a first and a second end portion and a portion which is closer to the first end portion than to the second end portion. The first end portion is electrically connected to the upper electrode. The second end portion is electrically connected to either the source or the drain through the contact hole. The contact is electrically isolated from the lower electrode by the side-wall insulating film. The contact is made of at least one material, and at least the first end portion and the portion close to the first end portion are made of that material. The upper electrode is also made of that material so that the first end portion of the contact and the upper electrode are joined each other.

The present invention further provides a method of fabricating a semiconductor device. At least one transistor is formed on a semiconductor substrate, the transistor having a source, a drain and a gate. An insulating film with at least one contact hole is formed on the substrate to cover the gate. At least one capacitor is formed on the insulating film, the capacitor having a lower electrode, a ferroelectric film and an upper electrode stacked in order. A side-wall insulating film is formed to cover side faces of the lower electrode and the ferroelectric film. A contact is formed which has a first and a second end portion and a portion which is closer to the first end portion than to the second end portion, to electrically connect the first end portion to the upper electrode and the second end portion to either the source or the drain through the first contact hole, to electrically isolate the contact from the lower electrode by the side-wall insulating film, the contact being made of at least one material, at least the first end portion and the portion close to the first end portion being made of that material, the upper electrode being also made of that material so that the first end portion of the contact and the upper electrode are joined each other.

DETAILED DESCRIPTION OF PREFERRED EMBODIMENTS

Preferred embodiments according to the present invention will be described with reference to the attached drawings.

The first preferred embodiment according to the present invention will be described with reference to FIGS. 1 to 12B. Shown in FIGS. 1 to 8 are sectional views for explaining sequential processes of fabricating a non-volatile semiconductor memory having ferroelectric capacitors.

Figure 1:
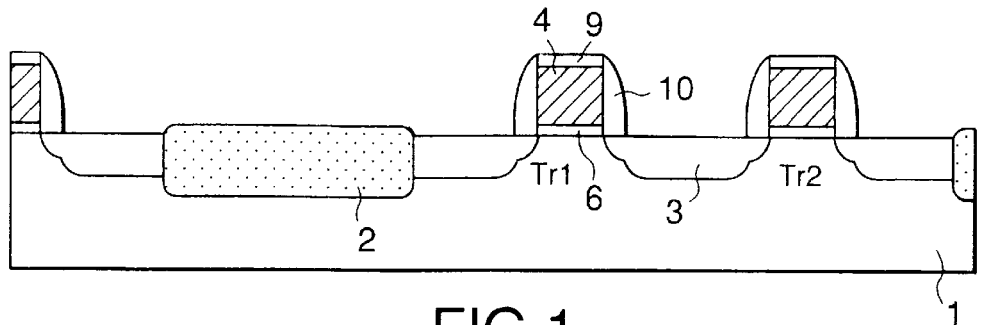
FIGS. 1 to 8 show the first preferred embodiment for processes of fabricating a semiconductor device according to the present invention.

As shown in FIG. 1, a semiconductor substrate 1 which is a p-type in this embodiment is etched to form a trench of 0.3 $\mu$m depth for a shallow trench isolation (STI) region that will isolate transistors to be formed from each other. The isolation region decides regions of a source, drain and gate of each transistor.

A silicon dioxide ($SiO_2$) film 2 of about 1.5 $\mu$m thickness is then deposited all over the substrate 1 by chemical vapor deposition (CVD) using a gas which is a mixture of a tetraethylorthosilicate (TEOS) gas and an ozone gas. The $SiO_2$ film 2 is polished by chemical mechanical polishing (CMP) to be flat so that the film 2 is buried in the trench to form the STI region.

The process described so far forms transistor regions which are surrounded by the STI region of the $SiO_2$ film 2.

Next, deposited over the substrate 1 are a gate oxide film 6 of 10 nm-thick $SiO_2$ for example, a phosphorus-doped polysilicon film of 150 nm thickness (not shown), a 150 nm-thick tungsten film (also not shown) and a 200 nm-thick silicon nitride ($Si_3N_4$) 9. The deposited films are processed by photolithography to form a gate electrode 4 covered with the $Si_3N_4$ film 9 of 0.25 $\mu$m thickness.

Another silicon dioxide film of 30 nm thickness is deposited all over the substrate 1. The entire surface of the substrate 1 is etched by reactive ion etching (RIE) to form side-wall insulating films 10 on the side of the gate electrode 4 and the $Si_3N_4$ film 9 to form a gate electrode structure.

The substrate 1 is doped with n-type impurities, such as phosphorus, by ion implantation to form an impurity-diffusion region 3 which will become a source and drain.

The processes described above are performed to form transistors Tr1 and Tr2.

Figure 2:
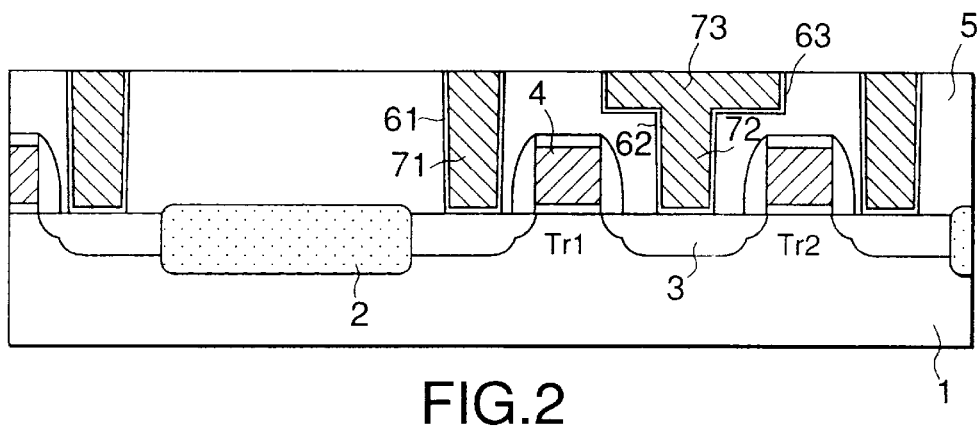

Next, as shown in FIG. 2, a mid-layer insulating film 5, such as a $SiO_2$ film, is deposited all over the substrate 1 which is then planarized by chemical mechanical polishing (CMP). Formed in the flattened substrate 1 are a first contact hole (window) 61, a second contact hole (window) 62 which reaches the impurity-diffusion region 3 in the substrate 1, and a trench 63 which is linked to the hole 62 and which will be filled with a wiring material used as a bit line. The trench 73 extends so that it is perpendicular to the plane of FIG. 2.

Barrier metal layers of Ti/TiN, for example, are formed in the holes 61 and 62, and the trench 63. The holes and trench are then filled with tungsten films by blanket CVD to form a first contact 71, a second contact 72 and a buried contact 73, respectively. The excess barrier metal layers and tungsten films over the holes and trench are removed by CMP.

Figure 3:
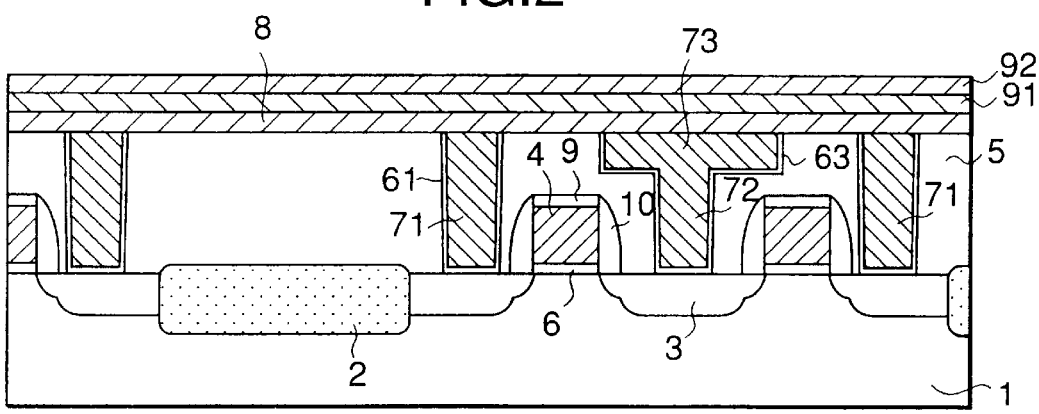

Next, as shown in FIG. 3, a silicon nitride ($Si_3N_4$) film 8 is deposited all over the substrate 1. Deposited over the $Si_3N_4$ film 8 in oder are a stacked conductive layer 91 of Ti/Pt as a lower electrode, and a ferroelectric capacitor layer 92 of lead zirconate titanate (PZT), that is, $Pb(Zr_xTi_{1-x})O_3$. The layer 92 is then crystallized by rapid themal annealing (PTA) at 750° C.

Figure 4:
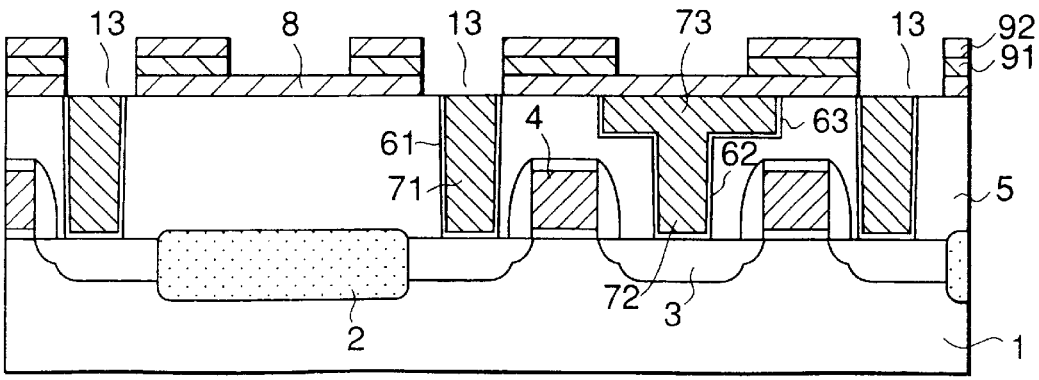

Next, as shown in FIG. 4, some portions of the $Si_3N_4$ film 8, the stacked conductive layer 91 and the ferroelectric capacitor layer 92 are removed by photolithography and reactive ion etching (RIE). In detail, a window 13 is opened by removing the film 8 and the layers 91 and 92 on the contact hole 61 which will connect the substrate 1 and an upper electrode. The other portions of the $Si_3N_4$ film 8 except the portion on the contact hole 61 are not removed.

Figure 5A:
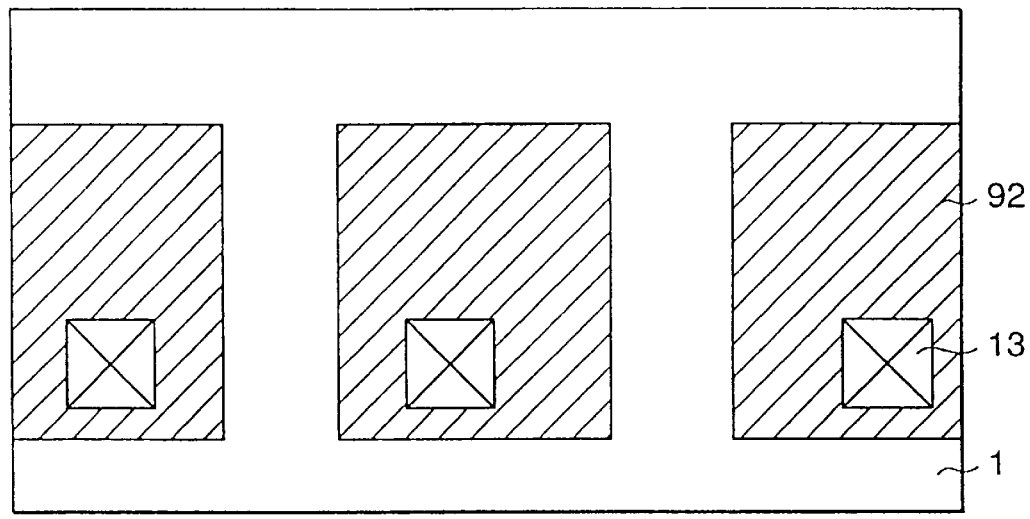

The window 13 is rectangular so that it touches, at the four edges, the stacked conductive layer 91 and the ferroelectric capacitor layer 92, as shown in FIG. 5A. The contact hole 61 is located just under the capacitor. The window 13 and the upper surface of the contact hole 61 need not meet each other completely. It is enough that a portion of the contact hole 61 is exposed to the window 13. Their area relationship is not so important.

Figure 5B:
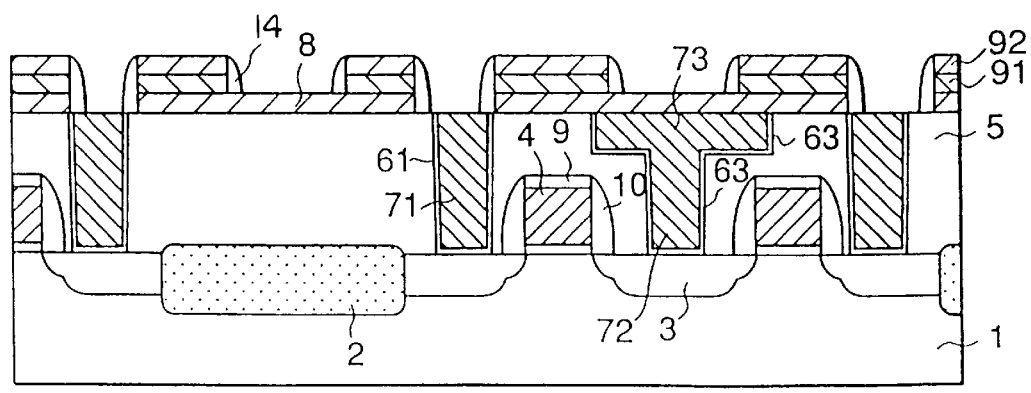

An $Si_3N_4$ film is again deposited all over the substrate 1, and then removed by RIE. The film removal results in a side-wall insulating film 14 formed by self-alignment around the inner wall of the window 13 and the outer walls of the stacked conductive layer 91 and the ferroelectric capacitor layer 92, as shown in FIG. 5B.

Figure 6:
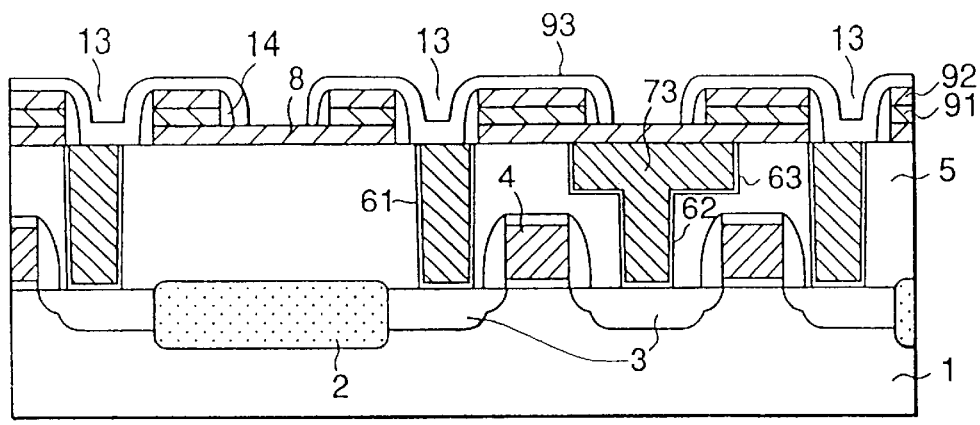

Next, as shown in FIG. 6, a film of indium (In) is deposited all over the substrate 1 by sputtering. The In film is then patterned by photolithography and RIE to form an upper electrode 93. The upper electrode 93 of the ferroelectric capacitor is connected, by self-alignment, to the contact hole 61 which has been connected to the impurity diffusion region 3 in the substrate 1.

Figure 25:
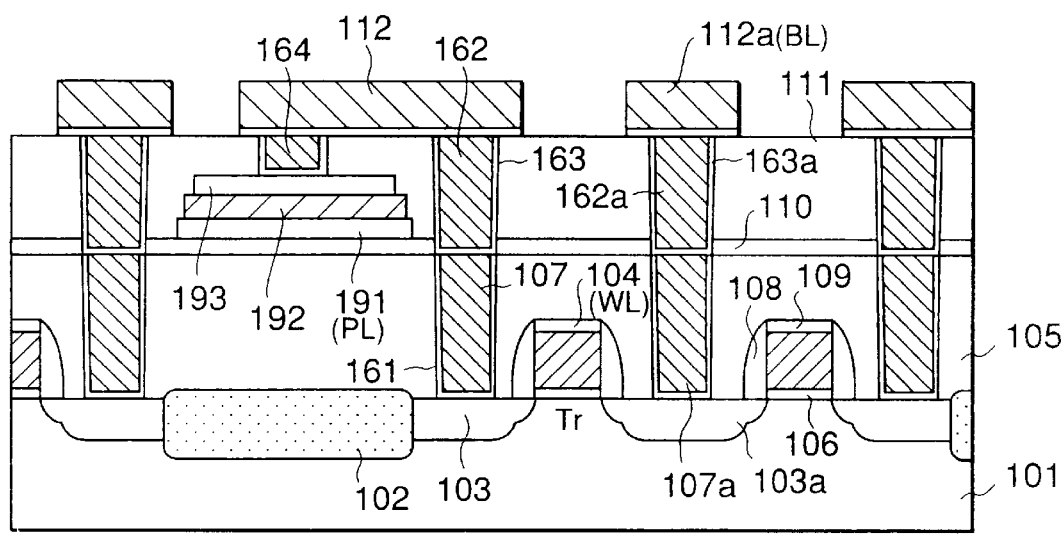
FIG. 25 shows conventional processes of fabricating a semiconductor device.

This connection between the upper electrode 93 and the impurity diffusion region 3 by self-alignment removes another contact hole, such as the contact hole 163 shown in FIG. 25. The window 13 is extremely shallower than the contact hole 163 (FIG. 25), and this shallow hole makes possible the formation of the upper electrode 93 by sputtering.

The upper electrode 93 and the lower electrode 91 are insulated from each other by the side-wall insulating film 14 which has been formed by self-alignment. This self-alignment formation overcomes the problem discussed with respect to FIG. 25. In other words, the present invention almost neglects design in distance from consideration, such as the distance between the contact hole 163 and the capacitor stacked layers in FIG. 25. The neglecting of such design achieves high capacitor density on the substrate 1.

Figure 7:
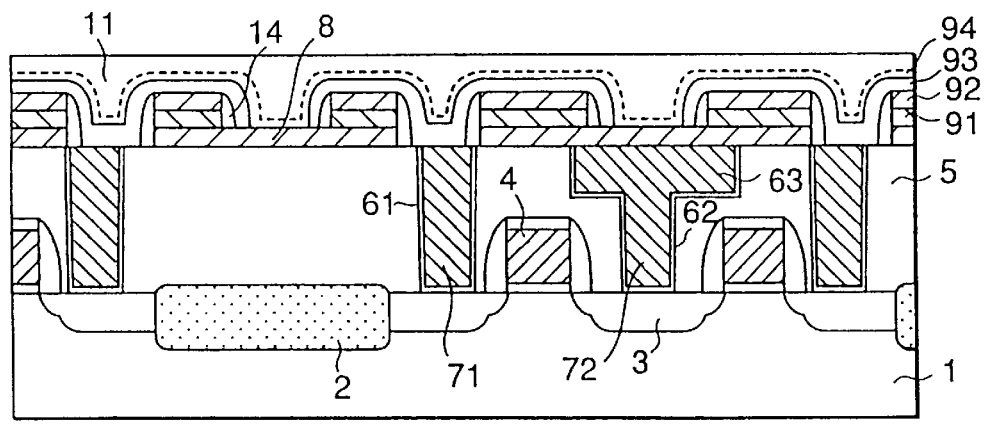

Next, as shown in FIG. 7, a mid-layer insulating film 11 of $SiO_2$, etc., is deposited all over the substrate 1. The surface of the film 11 is planarized by CPM to cover the capacitors. The capacitors may also be covered by a hydrogen diffusion blocking film 94 under the insulating film 11, which will be explained later.

Figure 8:
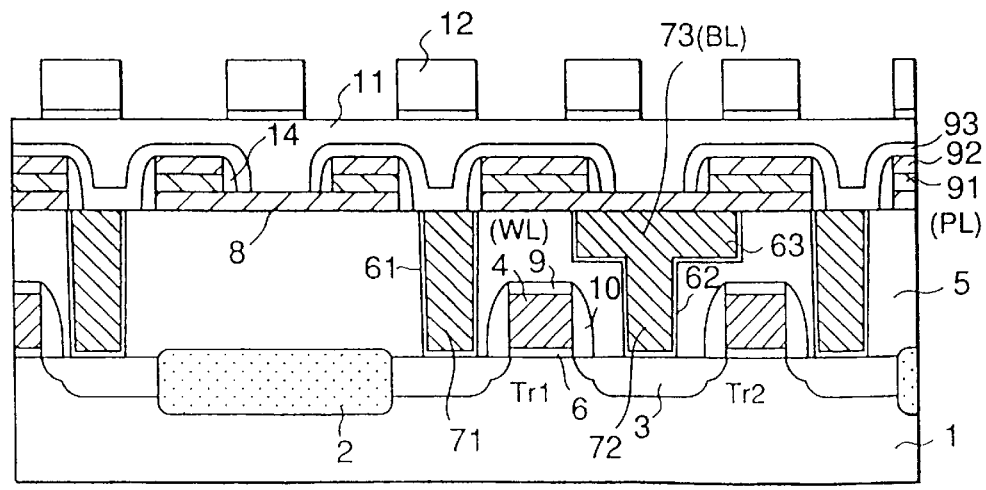

Then, as shown in FIG. 8, a metallic contact 12 of aluminum (Al), etc., is formed as the first layer over the flattened surface of the mid-layer insulating film 11 to fabricate a non-volatile semiconductor memory.

As disclosed above, the contact according to the invention reaches the impurity diffusion region for the source and drain regions via the contact hole. The contact is joined to the upper electrode because they are made of the same metal. The contact thus electrically connects the upper electrode of each capacitor and the impurity diffusion region. On the other hand, the contact is insulated from the lower electrode of the capacitor by the side-wall insulating film formed over the inner wall of the hole formed in the ferroelectric film and the capacitor.

This contact structure provides the contact hole just under the lower electrode of each capacitor to markedly reduce the space for each transistor cell. Furthermore, the present invention extremely reduces contact resistance between the contact and the upper electrode because the same metal is used for them. The space for the electrical connection according to the invention can further be reduced for advancement in cell miniaturization.

As shown in FIG. 5B, the contact hole 61 is provided just under the lower electrode 91 of each capacitor in this embodiment. The present invention however is not limited to such structure. The contact hole may be close to the capacitor. Or, a portion of the contact hole may be provided just under the capacitor.

The arrangements of the contact hole and capacitor are disclosed with reference to FIGS. 9A to 12B.

Figure 9A:
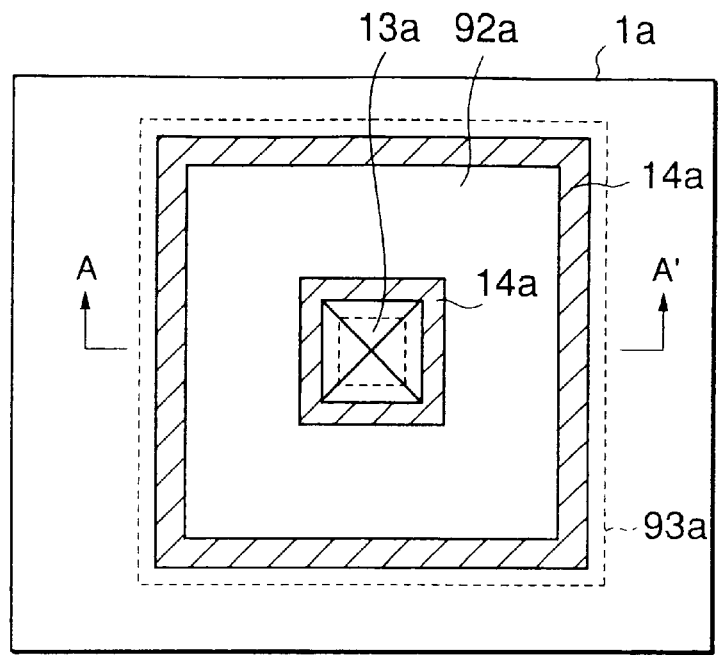
FIGS. 9 to 12B illustrate the arrangement of a capacitor and a contact hole.
Figure 9B:
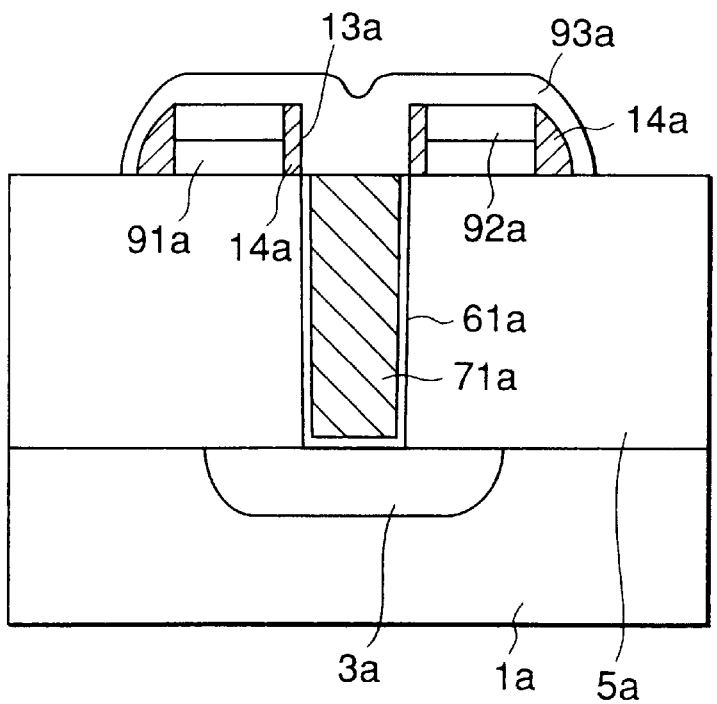

The contact hole/capacitor arrangement illustrated in FIGS. 9A and 9B is similar to that shown in FIGS. 5A and 5B. A contact hole 61a with a buried contact 71a is provided just under the capacitor and almost the center of capacitor stacked films 91a and 92a. Deposited over a window 13a of the capacitor stacked films is the other contact joined to an upper electrode 93a. This contact is made of the material the same as that of which the upper electrode 93 is made. The contact corresponds to the portion of the upper electrode which is not located over the ferroelectric film 92a. The contact is electrically linked to the contact 71a buried in the contact hole 61a.

Figure 10A:
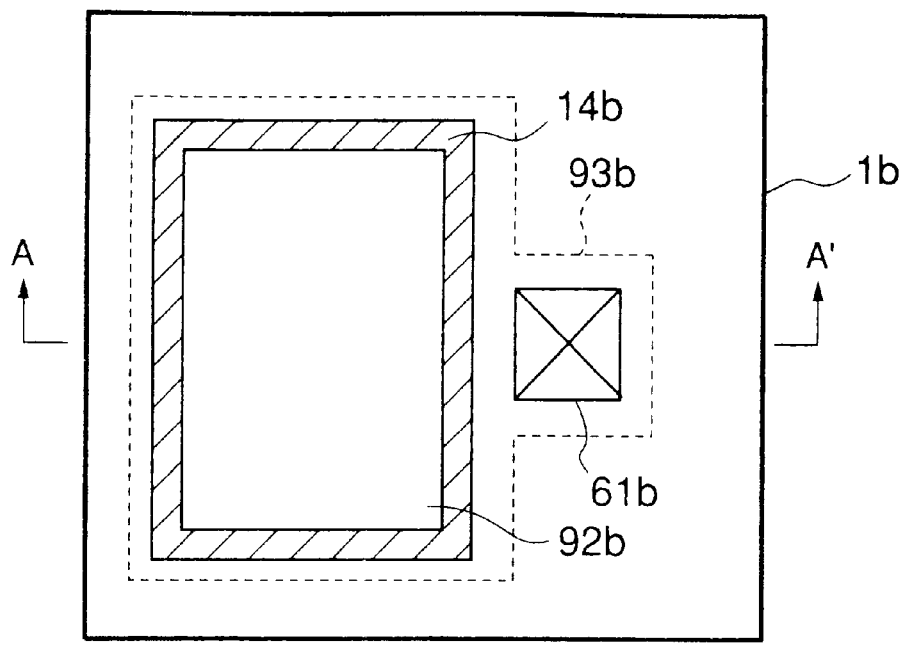
Figure 10B:
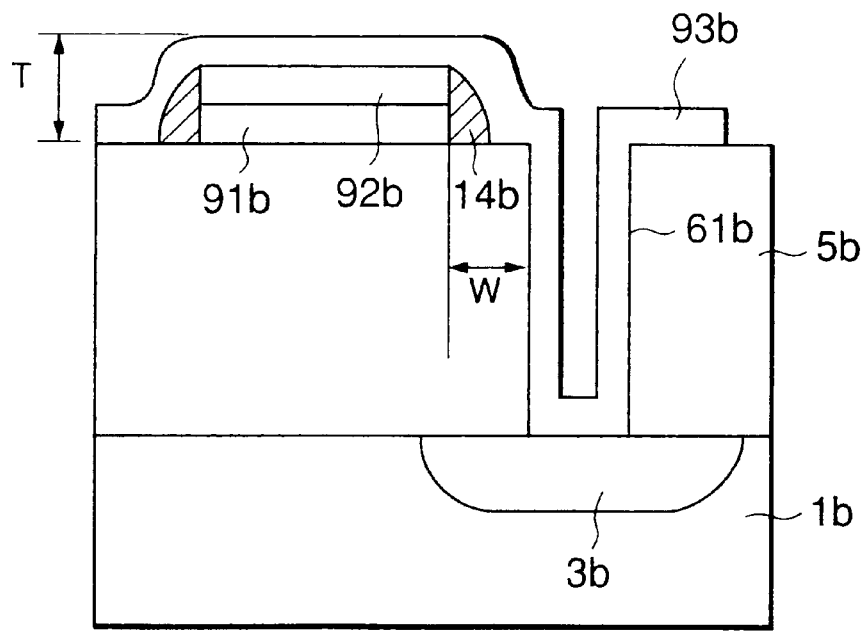

Illustrated in FIGS. 10A and 10B is that a contact hole is formed outside a capacitor but close to each other. A contact hole 61b formed in a mid-layer insulating film 5b is close to capacitor stacked films 91b and 92b. Deposited in the contact hole 61b is a contact made of the material the same as that for an upper electrode 93b. The contact is electrically connected to an impurity diffusion region 3b through the contact hole 61b.

This contact hole/capacitor arrangement does not serve well for semiconductor memory miniaturization because the contact hole 61b is provided outside the capacitor stacked films 91b and 92b. On the other hand, the space for the electrical connection can be reduced markedly because the contact is joined to the upper electrode 93b. The material used for both the contact and the upper electrode 93b prevents metal diffusion which would occur when different kinds of metals are used for the contact and upper electrode.

Figure 11A:
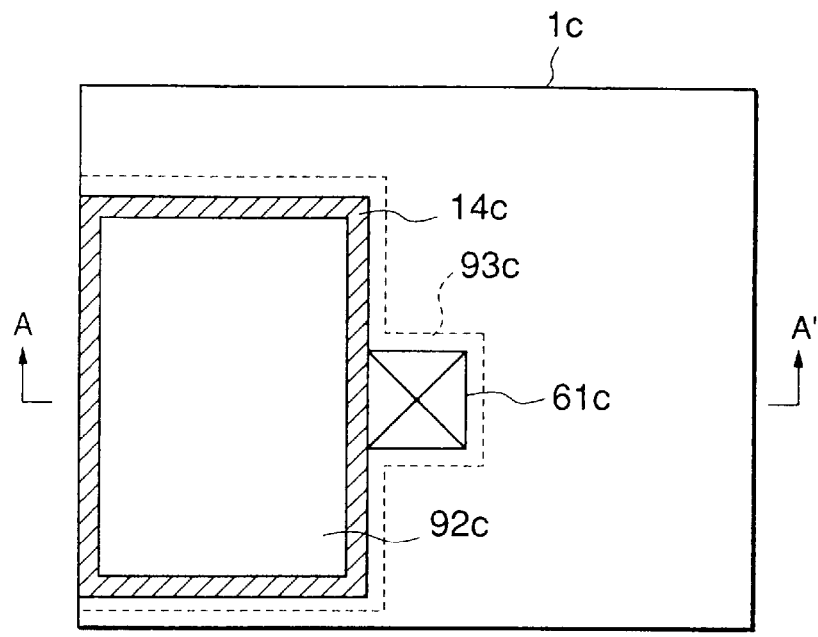
Figure 11B:
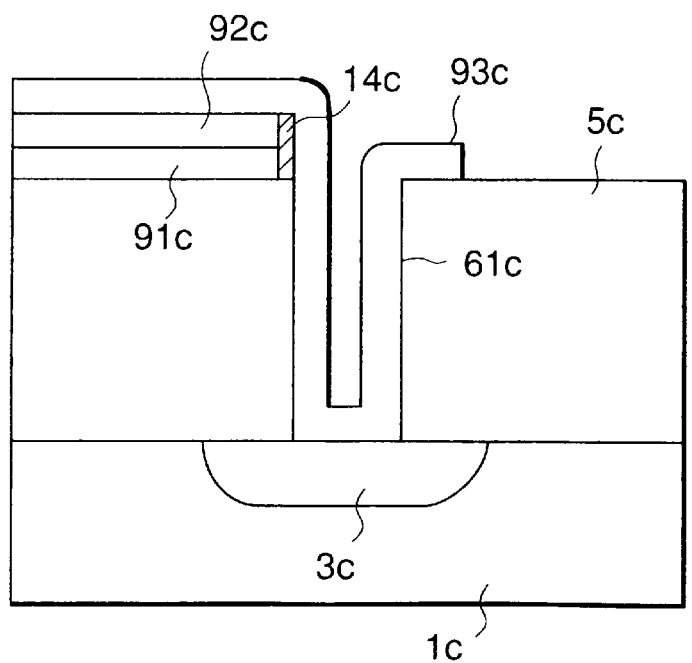

Illustrated in FIGS. 11A and 11B is that a contact hole is formed outside a capacitor but very close to each other compared to the structure shown in FIGS. 10A and 10B. A contact made of the material the same as that for an upper electrode 93c is deposited in a contact hole 61c. The contact is electrically connected to an impurity diffusion region 3c through the contact hole 61c.

The structure in which the contact hole 61c is very close to capacitor stacked films 91c and 92c advances semiconductor memory miniaturization. A side-wall insulating film 14c formed over the side wall of the capacitor stacked films reduces the space markedly for the electrical connection to directly connects the contact and the upper electrode 93c. The material used for both the contact and the upper electrode 93c also prevents the metal diffusion which is discussed with reference to FIGS. 10A and 10B.

Figure 12A:
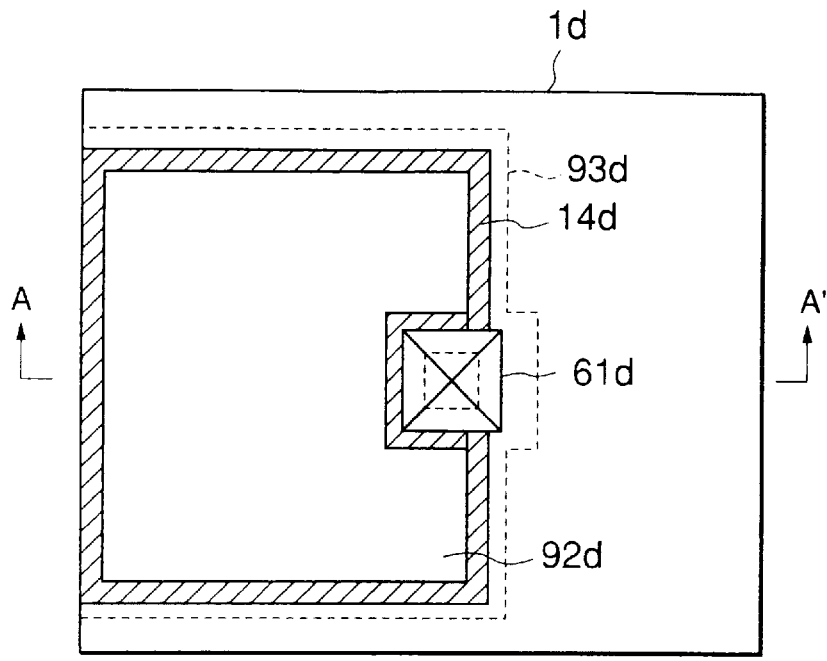
Figure 12B:
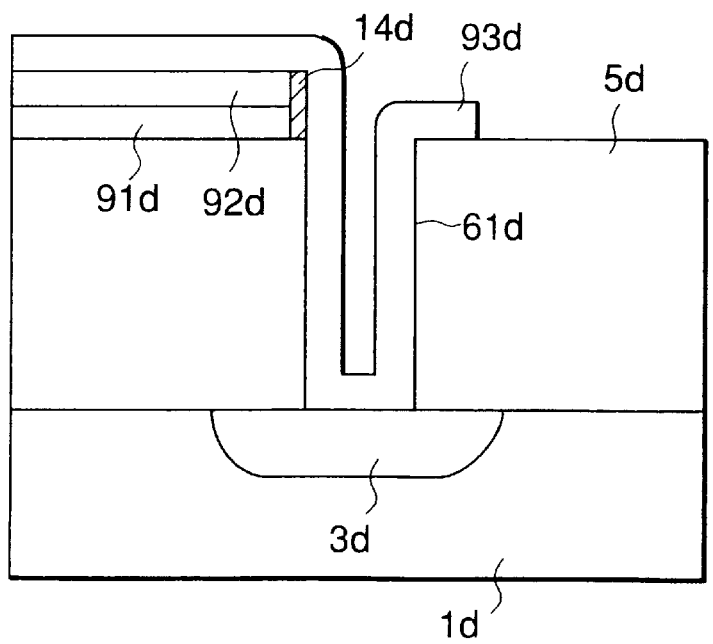

Illustrated in FIGS. 12A and 12B is that a contact hole is formed so that its portion is located just under a capacitor. A contact hole 61d touches, at its one edge, one of capacitor stacked films, that is, a ferroelectric film 92d. A portion of each of two edges of the contact hole 61d touches the capacitor stacked films. Deposited in the contact hole 61d is a contact made of the material the same for an upper electrode 93d. The contact is connected to an impurity diffusion region 3d through the contact hole 61d.

This modification also advances semiconductor memory miniaturization because a portion of the contact hole 61d is located just under the capacitor stacked films. A side-wall insulating film 14d formed over the side wall of the capacitor stacked films markedly reduces the space for the electrical connection with direct connection of the contact and the upper electrode 93d. The material used for both the contact and the upper electrode 93d also prevents the metal diffusion which is discussed with reference to FIGS. 10A and 10B.

The capacitor-contact hole arrangements shown in FIGS. 5A, 5B and 9A to 12B, follow the following thickness-width relationship.

For example, in FIG. 10B, the total thickness T of the capacitor layers 91b, 92b and 93b is larger than or at least equal to the width W, the distance from the inner edge of the side-wall insulating film 14b to the edge of the contact hole 61b. A contact hole formed out of this thickness-width relationship or far from the capacitor increases resistance therebetween.

The first embodiment described above achieves direct connection between the upper electrode of a ferroelectric capacitor and a semiconductor substrate. The direct connection in this embodiment markedly reduces the space over transistors which is the must for the structure shown in FIG. 25. The first embodiment electrically connects a semiconductor substrate and capacitors after the deposition of a ferroelectric film and the thermal process for crystallization of the film. The sequential processing steps prevent the reaction which would occur between capacitor electrodes and metallic material buried in contact holes due to highly thermal process. The highly thermal process has been one of the problems for capacitor-on plugging (COP).

The second preferred embodiment according to the present invention will be described with reference to FIGS. 13 to 20. Shown in these drawings are sectional views for explaining sequential processes of fabricating a non-volatile semiconductor memory having ferroelectric capacitors.

Figure 13:
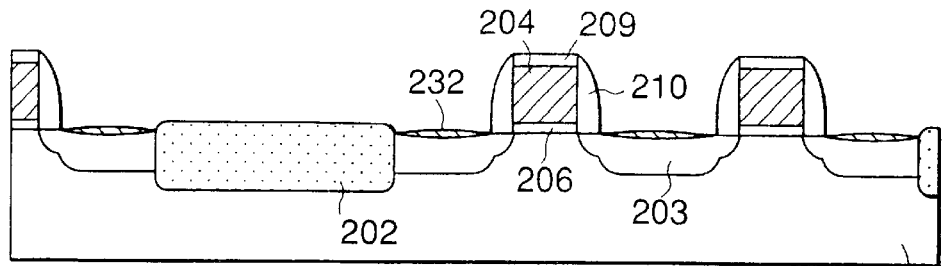
FIGS. 13 to 20 show the second preferred embodiment for processes of fabricating a semiconductor device according to the present invention.

As shown in FIG. 13, formed on a semiconductor substrate 201 are an $SiO_2$ film 202 for device isolation, a gate oxide film 206, a gate electrode 204, and an impurity-diffusion region 203 which will become a source and drain in order, according the same processes as those for the first embodiment.

Formed on the gate electrode 204 is a silicon nitride film 209, the side wall of which is covered with a side-wall insulating film 210. A titanium silicide (TiSi) 232 is then formed by self-alignment over the portion of the impurity-diffusion region which 203 which is exposed from the substrate 201.

Figure 14:
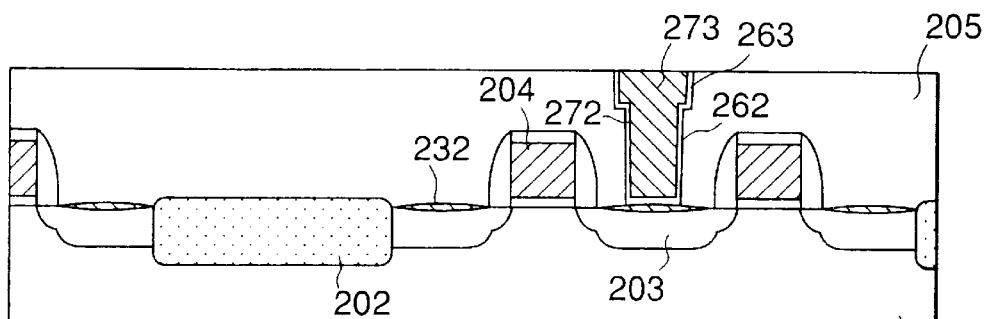

Next, as shown in FIG. 14, a mid-layer insulating film 205 of $SiO_2$, etc., is deposited over the substrate 201 and planarized by CPM. The film 205 is then etched to form a trench 263 which will be filled with a metal material for a bit line, and a contact hole 262 which is linked to the trench 263 and reaches the impurity diffusion region 203 in the substrate 201.

Barrier metal layers of Ti/TiN are formed in the hole 262 and the trench 263. The hole and trench are then filled with tungsten films by blanket CVD to form a contact 272 and a contact 273, respectively. The excess barrier metal layers and tungsten films over the hole and trench are removed by CMP.

Figure 15:
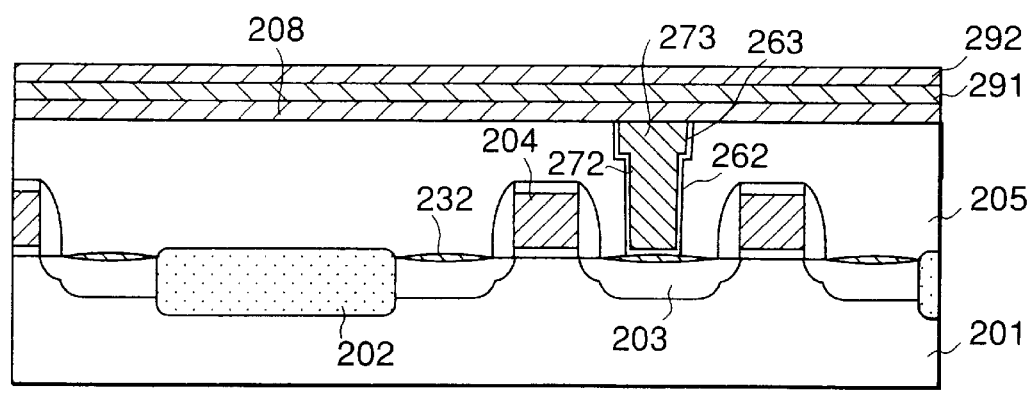

Next, as shown in FIG. 15, like the first embodiment, a silicon nitride film 208, a stacked conductive layer 291 of Ti/Pt as a lower electrode, and a ferroelectric capacitor layer 292 of PZT are deposited in order. The PZT layer 292 is crystallized by PTA at 750° C.

Figure 16:
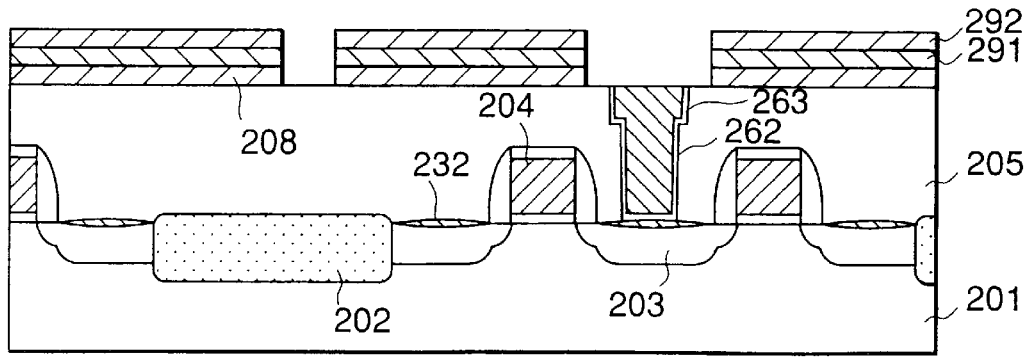

Next, as shown in FIG. 16, some portions of the ferroelectric capacitor layer 292 and the stacked conductive layer 291 are removed by photolithography and RIE to form a capacitor region of capacitor stacked films.

Figure 17:
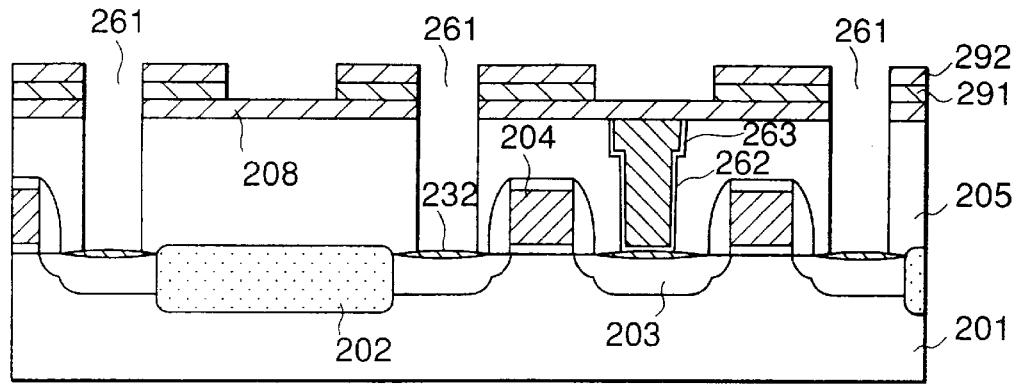

Next, as shown in FIG. 17, the capacitor stacked films are opened by photolithography and RIE to form a contact hole 261 in the capacitor region. The hole 261 reaches the impurity diffusion region 203 in the substrate 201.

Figure 18:
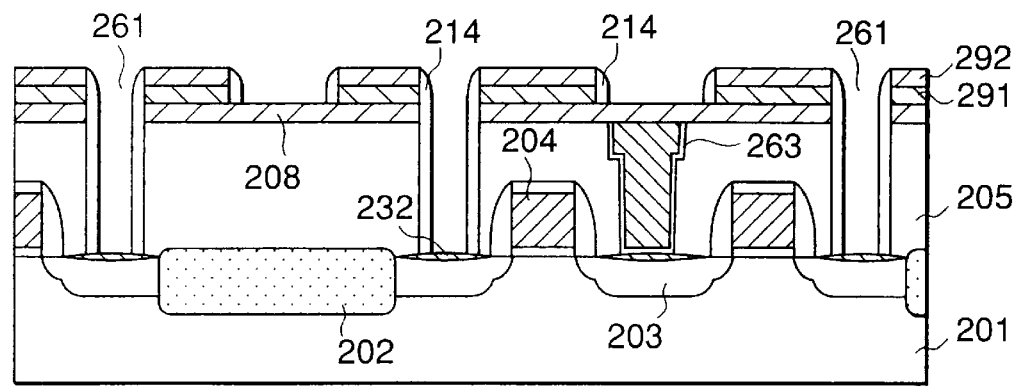

Next, as shown in FIG. 18, a silicon nitride film is deposited all over the substrate 201 and etched by RIE to form a side-wall insulating film 214 by self-alignment. The film 214 is formed only over the inner wall of the hole and the outer wall of the capacitor stacked layers.

Figure 19:
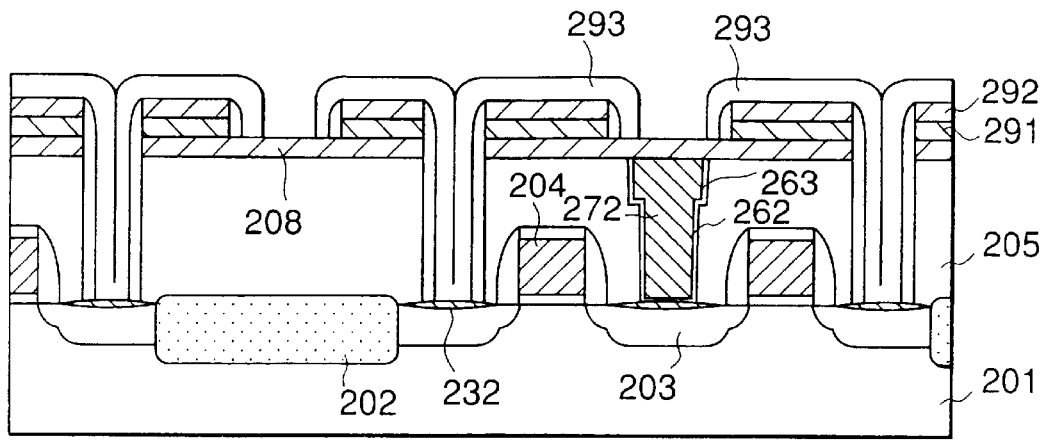

Next, as shown in FIG. 19, a film 293 of ruthenium (Ru) which will be the upper electrode of a capacitor is deposited all over the substrate 201 by CVD. The Ru film 293 is then processed by photolithography and RIE to form an upper electrode 293. The contact hole 261 is completely filled with the Ru film 293 whose thickness is larger than the radius of the hole 261.

This process shown in FIG. 19 connects the upper electrode 293 of the ferroelectric capacitor to the impurity diffusion region 203 in the substrate 201. The portion of the remaining Ru film 293 which touches the ferroelectric capacitor layer 292 becomes the upper electrode 293. The other portions of the remaining Ru film 293 which touch the side-wall insulating film 214 and the mid-layer insulating film 205 become contacts.

Figure 20:
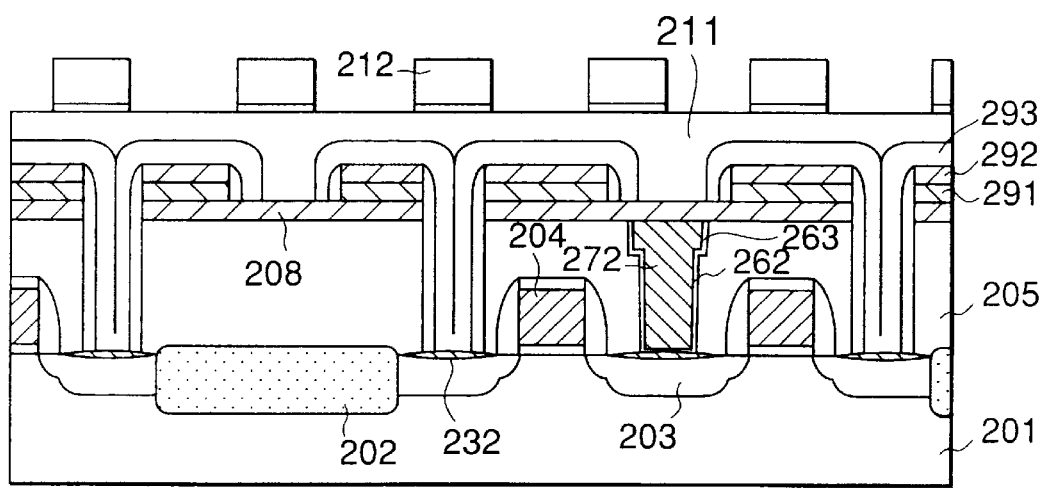

Then, as shown in FIG. 20, a mid-layer insulating film 211 is deposited all over the substrate 201 and flattened by CMP. A metallic contact 212 of Al, etc., is formed as the first layer over the flattened surface of the mid-layer insulating film 211 to fabricate a non-volatile semiconductor memory.

As disclosed above, the side-wall insulating film 214 formed by self-alignment isolates the upper electrode 293 and the lower electrode 291 each other. The second embodiment thus almost eliminates design in distance from consideration, such as the distance between the contact hole 163 and the stacked layers of the capacitor in FIG. 25. The elimination of such design achieves high capacitor density on the substrate 201. This embodiment also advances device miniaturization like the first embodiment.

Figure 21:
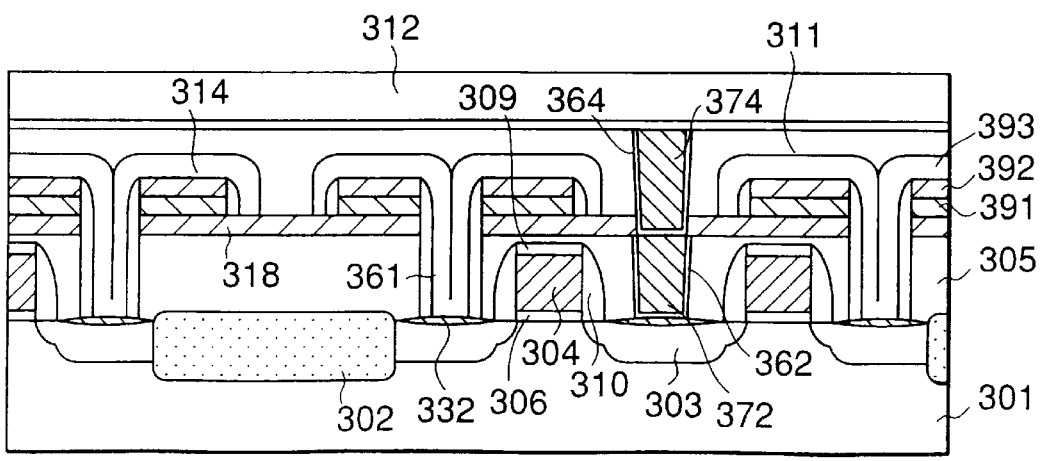
FIG. 21 shows the third preferred embodiment for processes of fabricating a semiconductor device according to the present invention.

The third preferred embodiment according to the present invention will be described with reference to FIG. 21. Shown in this drawing is the sectional view for explaining processes of fabricating a non-volatile semiconductor memory having ferroelectric capacitors.

The first and second embodiments use the contacts 73 and 273, respectively, buried in the contact holes for bit lines. On the other hand, the third embodiment uses a metallic contact of Al, etc., for bit lines. This structure provides a contact hole in a ferroelectric capacitor through which the capacitor and a semiconductor substrate are connected to each other to advance device miniaturization.

The basic structure for the third embodiment is similar to that for the second embodiment shown in FIG. 20. Like the second embodiment, as shown in FIG. 21, an $SiO_2$ film 302 for device isolation, a gate oxide film 306, a gate electrode 304, and an impurity diffusion region 303 for a source and drain are formed in order on a semiconductor substrate 301.

Formed on the gate electrode 304 is a silicon nitride film 309 the side wall of which is covered with a side-wall insulating film 310. A titanium silicide (TiSi) film 332 is formed by self-alignment over the portion of the impurity diffusion region 303 which is exposed from the substrate 301. A mid-layer insulating film 305 of $SiO_2$, etc., is deposited over the substrate 301 and flattened by CPM.

The mid-layer insulating film 305 is etched to form a contact hole 362 which reaches the impurity diffusion region 303 in the substrate 301. A barrier metal layer of Ti/TiN is formed in the hole 362 which is then filled with a tungsten film by blanket CVD to form a contact 372. The excess barrier metal layer and tungsten film over the hole are removed by CMP.

Next, like the second embodiment, a silicon nitride film 318, a stacked conductive layer 391 of Ti/Pt as a lower electrode, and a ferroelectric capacitor layer 392 of PZT are deposited in order. The PZT layer 392 is crystallized by PTA at 750° C.

Some portions of the ferroelectric capacitor layer 392 and the stacked conductive layer 391 are removed by photolithography and RIE to form a capacitor region of capacitor stacked films.

The capacitor stacked films are opened by photolithography and RIE to form a contact hole 361 in the capacitor region. The hole 361 reaches the impurity diffusion region 303 in the substrate 301.

Next, a silicon nitride film is deposited all over the substrate 301 and etched by RIE to form a side-wall insulating film 314 by self-alignment. The film 314 is formed only over the inner wall of the hole and the outer wall of the capacitor stacked layers.

A film 393 of Ru which will become the upper electrode of a capacitor is deposited all over the substrate 301 by CVD. The Ru film 393 is then processed by photolithography and RIE to form an upper electrode 393. The contact hole 361 is completely filled with the Ru film 393 whose thickness is larger than the radius of the hole 361.

This process connects the upper electrode 393 of the ferroelectric capacitor to the impurity diffusion region 303 in the substrate 301. The portion of the remaining Ru film 393 which touches the ferroelectric capacitor layer 392 becomes the upper electrode 393. The other portions of the remaining Ru film 393 which touch the side-wall insulating film 314 and the mid-layer insulating film 305 become the contacts.

Then, a mid-layer insulating film 311 is deposited all over the substrate 301 and flattened by CMP. A contact hole 364 is formed in the film 311 to reach the contact 372. The hole 364 is filled with a contact 374 which is made of the material the same as that for the contact 372. A metallic contact 312 of Al, etc., is formed as the first layer over the flattened surface of the mid-layer insulating film 311 to fabricate a non-volatile semiconductor memory.

As disclosed above, the side-wall insulating film 314 formed by self-alignment isolates the upper electrode 393 and the lower electrode 391 each other. The third embodiment thus almost eliminates design in distance from consideration, such as the distance between the contact hole 163 and the stacked layers of the capacitor in FIG. 25. The elimination of such design achieves high capacitor density on the substrate 301. This embodiment also advances device miniaturization like the first embodiment.

The transistors in the semiconductor device are damaged due to impurity implantation throughout the processes described in each embodiment. Such damage can be annealed out using nitrogen gas including hydrogen on the order of about 5% at 450° C. On the other hand, hydrogen damages the capacitors in this anneal process to decrease their ferroelectricity.

A hydrogen diffusion blocking film avoids such damage to the capacitors. As shown in FIG. 7, for example, a hydrogen diffusion blocking film 94 of a transition metal oxide, such as $Al_2O_3$, $TiO_2$ or $ZrO_2$, is deposited over the substrate 1 by reactive sputtering before deposition of the mid-layer insulating film 11.

Such a hydrogen diffusion blocking film cannot work for the semiconductor device shown in FIG. 25 because the contact hole 164 must be formed in the blocking film.

Disclosed next with reference to FIGS. 8 and 22A to 24 are functions of the non-volatile semiconductor memory having ferroelectric capacitors according to the present invention.

The non-volatile semiconductor memory disclosed in the embodiments can be used for identity cards working at radio frequencies (RF-ID), etc.

In FIG. 8, the gate electrode 4 and the lower electrode 91 are called a word line (WL), and a plate electrode or plate line (PL), respectively.

Figure 22A:
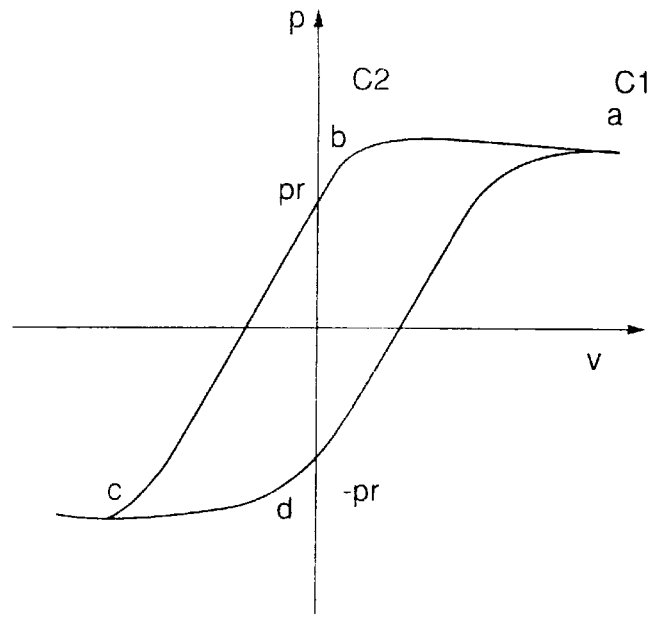
FIGS. 22A and 22B illustrate hysteresis curves of ferroelectric capacitors used for non-volatile semiconductor memories.

Shown in FIG. 22A is voltage-to-dielectric polarization characteristics of ferroelectric films such as a PZT film. As shown, ferroelectric films exhibit a hysteresis curve. Ferroelectric films store data according to its positive or negative residual dielectric polarization Pr when no voltage is applied.

Figure 22B:
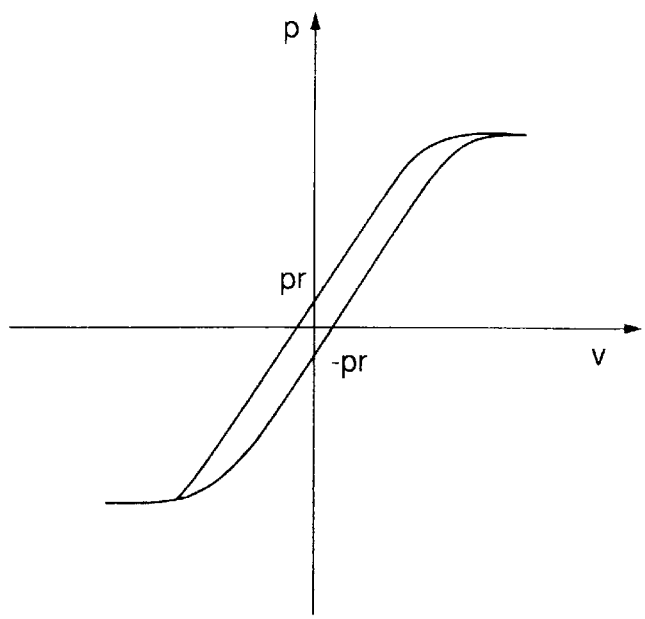

Shown in FIG. 22B is a hysteresis curve at a high temperature of 80° C. which is not preferable for ferroelectric memory cells. The curve shows an extremely small residual dielectric polarization Pr. Such a small polarization results in decrease in margin of reading by sense amplifiers, erasure of data due to external disturbance, etc.

Figure 23A:
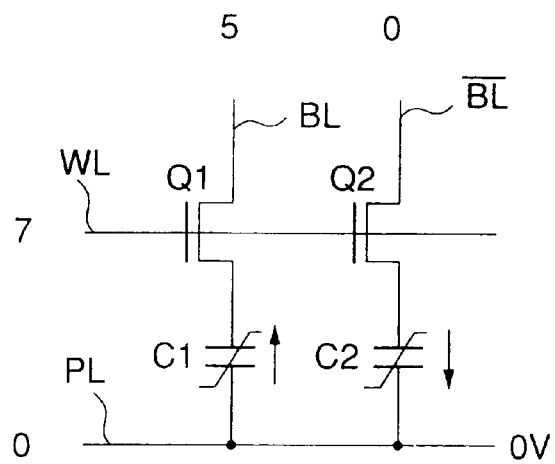
FIGS. 23A and 23B illustrate the operations of a non-volatile semiconductor memory fabricated according to the invention.
Figure 23B:
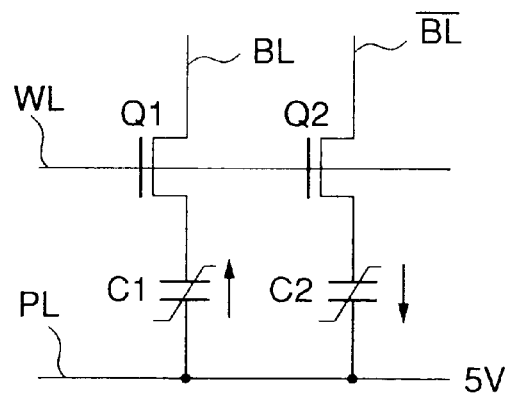
Figure 24:
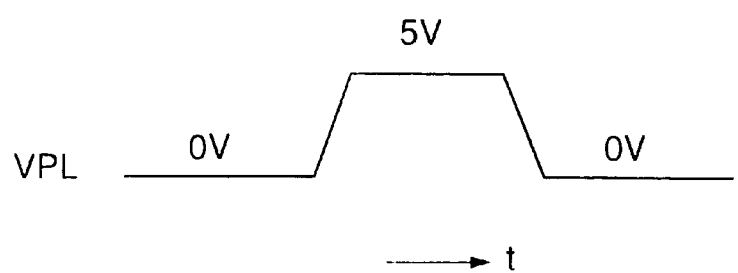
FIG. 24 illustrates changes in voltage applied to the non-volatile semiconductor memory illustrated in FIGS. 23A and 23B for memory switching.

Disclosed next with reference to FIGS. 23A to 24 are data writing and reading by non-volatile memories having ferroelectric random access memories (FRAMs) which can be fabricated by the processes described above. A memory cell for such non-volatile memories consists of two MOS switching transistors Q1 and Q2 and charge storage capacitors C1 and C2.

Defined in FIG. 23A is "1" where the capacitor C1 exhibits dielectric polarization in the upward direction which is the positive dielectric polarization, whereas the capacitor C2 exhibits dielectric polarization in the downward direction which is the negative dielectric polarization. On the other hand, FIG. 23B defines "0" where the capacitor C1 exhibits the negative dielectric polarization, whereas the capacitor C2 exhibits the positive dielectric polarization.

Steps for writing the data "1" in FRAMs are as follows:

As shown in FIG. 23A, voltages of 5V and 0V are applied to bit lines BL and /BL, respectively, where the sign "/" means inversion. Furthermore, voltages of 7V and 0V are applied to the word line WL and the plate line PL, respectively. This voltage, application gives residual dielectric polarization to the capacitors where the capacitors C1 and C2 are at the points "a" and "b", respectively, on the hysteresis curve in FIG. 22A.

Next, as shown in FIG. 23B, a voltage of 5V is applied to the plate line PL. This results in residual dielectric polarization where the capacitors C1 and C2 are at the points "b" and "c", respectively, in FIG. 22A.

The voltage applied to the plate line PL is returned to zero. This results in residual dielectric polarization where the capacitors C1 and C2 are at the points "a" and "d", respectively, in FIG. 22A.

Changes in voltage (VPL) applied to the plate line PL as disclosed above is shown in FIG. 24. This voltage application to the plate line PL gives the positive and negative dielectric polarization to the capacitors C1 and C2, respectively, as shown on FIG. 23A for the data "1" writing.

Described next are steps for writing the data "0" in FRAMs.

In FIG. 23A, voltages of 0V and 5V are applied to the bit lines BL and /BL, respectively. Furthermore, voltages of 7V and 0V are applied to the word line WL and the plate line PL, respectively. This voltage application gives residual dielectric polarization to the capacitors where the capacitors C1 and C2 are at the points "b" and "a" respectively, on the hysteresis curve in FIG. 22A.

Next, as shown in FIG. 23B, a voltage of 5V is applied to the plate line PL. This results in residual dielectric polarization where the capacitors C1 and C2 are at the points "C" and "b", respectively, in FIG. 22A.

The voltage applied to the plate line PL is returned to zero. This results in residual dielectric polarization where the capacitors C1 and C2 are at the points "d" and "a", respectively, in FIG. 22A.

This voltage application to the plate line PL gives the negative and positive dielectric polarization to the capacitors C1 and C2, respectively, as shown in FIG. 23B for the data "0" writing.

The non-volatile ferroelectric memories as described above consume low power so that they can be used for battery-free card-type mobile communications devices. The devices are powered with d. c. voltages given by rectifying carrier signals transferred from a main device. The communications devices have a circuitry for transmitting and receiving data on the carrier signals to and from a main device for non-contact communictions. Such cards can be used as drivers' licenses, catalogs, identity cards, communication tickets, and lift tickets for skiing, etc.

Ferroelectric materials useful for the present invention are, besides PZT, a layered ferroelectric material of Sr, Bi, Ta and O as main constituents, and also ferroelectric materials using Ba, Ti and O, and Ba, Sr, Ti and O, such as, BatiO, PLZT, $NiNb_3O$ and $K_3Li_2Nb_5O_{15}$. In other words, any oxide ferroelectric materials exhibiting ionic bond can be used for the present invention.

As described above, according to the present invention, a contact hole that connects the upper electrode of each capacitor and a semiconductor substrate is formed just under the capacitor or close to the capacitor as much as possible. This structure markedly decreases the space for each memory cell with extremely low contact resistance between the upper electrode and the contact.

Furthermore, the present invention allows crystallization of a ferroelectric film of each capacitor before forming a contact hole. The crystallization process avoids reaction of metals between the capacitor electrode and contact at the contact boundary.

It is further understood by those skilled in the art that the foregoing description are preferred embodiments of the disclosed devices and methods and that various change and modification may be made in the invention without departing from the spirit and scope thereof.

What is claimed is:

1. A semiconductor device comprising:
   a semiconductor substrate;
   at least one transistor formed on the semiconductor substrate, the transistor having a source, a drain and a gate;
   an insulating film having at least a first contact hole, the insulating film being formed on the semiconductor substrate to cover the gate;
   at least one capacitor formed on the insulating film, the capacitor having a lower electrode, a ferroelectric film and an upper electrode stacked in order;
   a side-wall insulating film to cover side faces of the lower electrode and the ferroelectric film;
   a contact having a first and a second end portion and a first portion which is closer to the first end portion than to the second end portion, the first end portion being electrically connected to the upper electrode and the second end portion being electrically connected to either the source or the drain through the first contact hole, the contact being electrically isolated from the lower electrode by the side-wall insulating film, the contact being made of at least a first material, at least the first end portion and the first portion being made of the first material, the upper electrode being also made of the first material so that the first end portion of the contact and the upper electrode are joined each other.

2. The semiconductor device according to claim 1, wherein the contact is made of the first material from the first end to the second end portions.

3. The semiconductor device according to claim 1, wherein the contact is also made of a second material, a second portion of the contact being made of the second material, the second portion being passing through the first contact hole, the second material being different from the first material of which the upper electrode is made.

4. The semiconductor device according to claim 1, wherein the first contact hole is provided so that the first contact hole is close to the lower electrode and the ferroelectric film to satisfy the relationship that the thickness of the capacitor is larger than or at least equal to the distance between the side faces covered with the side-wall insulating film and one edge of the first contact hole, the edge being closest to the capacitor than other edges of the first contact hole.

5. The semiconductor device according to claim 1, wherein at least an area of the first contact hole is located under the lower electrode.

6. The semiconductor device according to claim 5, wherein the lower electrode and the ferroelectric film are provided with a second contact hole that passes through the lower electrode and the ferroelectric film along the side faces covered with the side-wall insulating film, the second contact hole being located on the first contact hole, and the second hole being at least partially linked to the first contact hole so that the first end portion of the contact is electrically connected to the upper electrode through the second contact hole.

7. The semiconductor device according to claim 1, wherein the transistor and the capacitor function as a switching transistor and a charge storage capacitor, respectively, to constitute a memory cell of a non-volatile semiconductor memory.

* * * * *